United States Patent [19]

Hulseweh et al.

[11] Patent Number: 4,784,964

[45] Date of Patent: Nov. 15, 1988

[54] EPI DEFECT REDUCTION USING RAPID THERMAL ANNEALING

[75] Inventors: Terry Hulseweh; Mel Miller, both of Mesa, Ariz.

[73] Assignee: Motorola Inc., Schaumburg, Ill.

[21] Appl. No.: 109,684

[22] Filed: Oct. 19, 1987

[51] Int. Cl.[4] .................. H01L 21/265; H01L 21/477; H01L 21/324

[52] U.S. Cl. ..................... 437/26; 437/247; 437/248

[58] Field of Search .................. 437/26, 247, 248, 97, 437/129

[56] References Cited

U.S. PATENT DOCUMENTS

| 4,381,956 | 5/1983 | Lane | 148/175 |
| 4,717,687 | 7/1988 | Verma | 437/97 |

OTHER PUBLICATIONS

Ghandhi, VLSI Fabrication Principles, John Wiley & Sons, N.Y., 1983, pp. 606–609.
S. R. Wilson et al, "Rapid Isothermal Anneal of [75]As Implanted Silicon", Appl. Phys. Lett. 41(10), 15 Nov. 1982, pp. 978–980.
S. R. Wilson et al., "Isothermal Annealing of Ion Implanted Silicon with a Graphite Radiation Source", Mat. Res. Soc. Symp. Proc., vol. 13, (1983), Elsevier Science Publishing Co., Inc., pp. 369–374.
S. R. Wilson et al, "Rapid Isothermal Annealing of As—, P—, and B—Implanted Silicon", J. Appl. Phys., 55(12), 15 Jun. 1984, pp. 4162–4170.
S. R. Wilson et al, "Rapid Annealing Technology for Future VLSI", Solid State Technology, Jun. 1985, pp. 185–190.
C. W. White et al., "Supersaturated Substitutional Alloys Formed by Ion Implantation and Pulsed Laser Annealing of Group—III and Group—V Dopants in Silicon", J. Appl. Phys., 51(1), Jan. 1980, pp. 738–749.
R. T. Hodgson et al, "Rapid Thermal Annealing of Silicon Using an Ultrahigh Power Arc Lamp", Mat. Res. Soc. Symp. Proc., vol. 13, (1983), Elsevier Science Publishing Co., Inc., Jun. 8, 1983, pp. 355–360.
S. R. Wilson, "Transient Annealing of Ion Implanted Semiconductor Materials", Nuclear Instruments and Methods in Physics Research B6 (1985), pp. 307–315.

*Primary Examiner*—Donald L. Walton
*Attorney, Agent, or Firm*—Robert M. Handy

[57] ABSTRACT

Formation of defects in epi-layers above buried layers, particularly above arsenic buried layers, is substantially reduced by providing a brief high temperature Rapid Thermal Annealing (RTA) step after buried layer implantation, annealing-activation, and junction drive-in and before epi-layer growth. Among other things, the RTA step reduces the formation of arsenic precipitates which is frequently a consequence of slow cools commonly associated with conventional furnace activation-annealing, junction drive-in, and delineation oxidation prior to epi-layer growth.

18 Claims, 2 Drawing Sheets

EPI DEFECT REDUCTION USING RAPID THERMAL ANNEALING

BACKGROUND OF THE INVENTION

This invention concerns means and methods for semiconductor devices and, more particularly, improved means and methods for semiconductor devices having buried doped layers covered by an epitaxial layer.

It is common in the semiconductor art to form semiconductor devices in which doped regions are buried within the semiconductor material underneath an epitaxial semiconductor layer. An example of such a region commonly used in bipolar integrated circuits is a buried collector contact referred to in the art as a "buried layer". As used herein, the words "buried layer" or "buried region" or "buried layer region" are intended to refer not only to buried bipolar transistor collector contacts, but generally to doped regions having relatively higher doping buried beneath epitaxial layers in semiconductor devices.

There are many circumstances wherein it is desired to form buried layers which are more highly doped than the overlying material. However, when epitaxial layers are formed above highly doped buried layers it is found that the defect density in the epi-layer is generally much higher above the buried layers than elsewhere. The presence of the relatively high doping density in the buried layers produces a variety of surface defects which adversely influence the perfection of the epi-layer grown thereon. This is undesirable since defects in the epi-layer, particularly in active regions such as are commonly found above buried layers, are a source of low yield during semiconductor device manufacture.

Despite the fact that buried layers of boron, antimony, arsenic, phosphorous and other dopants are widely used in semiconductor devices, the problem of epi defects related to buried layers has not been entirely solved. Thus, a need continues to exist for improved means and methods for reducing the defect densities in epitaxial layers formed over buried layers.

Accordingly, it is an object of the present invention to provide improved means and methods for forming epitaxial layers on semiconductor substrates containing buried layers or other buried regions of higher doping than the overlying epi-layer.

It is an additional object of the present invention to provide improved means and methods for forming epitaxial layers on semiconductor substrates containing arsenic doped buried layers.

It is a further object of the present invention to provide improved means and methods for forming epitaxial layers on semiconductor substrates containing both arsenic doped buried layers and buried layers having other dopants.

It is an additional object of the present invention to provide improved means and methods for forming epitaxial layers on semiconductor substrates containing arsenic doped buried layers by minimizing arsenic precipitation prior to epitaxial layer growth.

SUMMARY OF THE INVENTION

The foregoing and other objects and advantages are provided by the method and means of the present invention wherein a semiconductor substrate is doped with a first dopant, typically arsenic or antimony, the doped substrate is first heated, typically in a standard furnace tube, under conditions wherein $(Dt)^{\frac{1}{2}}$ is greater than or equal to $5 \times 10^{-6}$ cm or heated under conditions including a temperature ramp-down from an elevated temperature exceeding about 900° C. to a temperature of 750° C. or less at a ramp rate of less than 6° C. per minute, thereafter rapidly heating the doped substrate to a temperature exceeding about 1000° C. in a time less than about 60 second, holding the wafer substantially at the latter temperature for a time of at least about 1 second but less than about 60 seconds, then rapidly cooling back below 600°–750° C. in a time less than about 30 seconds, preferably less than about 10 seconds, removing any dielectric from the substrate surface, and thereafter forming an epitaxial semiconductor layer on the substrate surface at least over the doped region.

A more complete understanding of the present invention along with further advantages thereof can be attained from the following description in conjunction with the accompanying drawings.

DETAILED DESCRIPTION OF THE DRAWINGS

Figure 1:
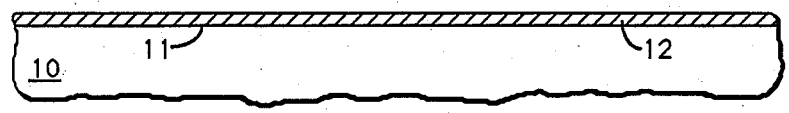
FIGS. 1–4 are simplified cross-sectional views of a semiconductor substrate having a doped region underneath an epitaxial layer, during different stages of manufacture, according to the present invention.
Figure 2:
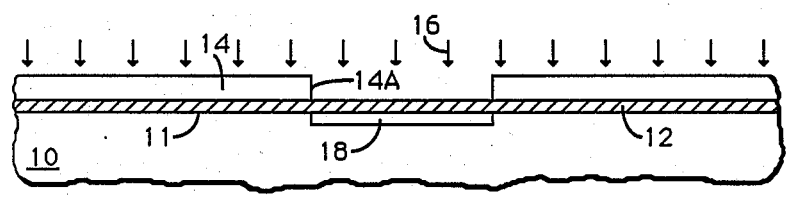

FIG. 1 is a simplified cross-sectional view of semiconductor substrate 10, e.g., a silicon semiconductor wafer, having surface 11 on which has been provided surface dielectric layer 12, preferably of silicon oxide. Layer 12 is usefully about 0.01–1.0 micrometers thick with about 0.02 micrometers thickness being preferred. Layer 12 may be formed by any convenient means well known in the art, but where substrate 10 is of silicon, thermal oxidation is preferred. However, chemical vapor deposition (CVD) of oxide or other dielectrics may also be used. Such techniques and other dielectric materials are well known in the art. Among other things, layer 12 conveniently acts as a surface protective screen oxide during implant doping of region 18 (FIG. 2). Layer 12 is preferred but not essential.

As shown in FIG. 2, substrate 10 (with layer 12, in this example) is covered with mask 14 having opening 14A. Mask 14 may be of any convenient material for masking substrate 10 against doping. Where doping is by ion implantation, mask 14 may be of photoresist. Where doping is by diffusion, then mask 14 may conveniently be of silicon oxide, silicon nitride or combinations thereof. Means for forming such masks are well known in the art. Other masking materials well known in the art may also be used.

Dopant 16 is conveniently injected by ion implantation through opening 14A. into region 18 of substrate 10. Arsenic is an example of a convenient dopant which is suitable for forming N+ buried layers. Other dopants well known in the art can also be used. Where doping is by ion implantation, the dopant implanted in region 18 is not yet activated at this point in the process.

Where mask 14 is of photoresist it is removed after the implant. Where more refractory materials, e.g., silicon oxide or silicon nitride, are used for mask 14, they may be removed or left in place temporarily following the doping step, e.g. until just before epi growth.

Figure 3:
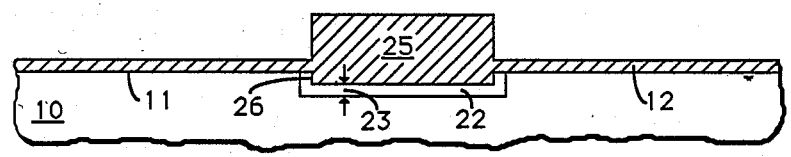

The structure is then heated to a sufficient temperature and for a sufficient time to activate the dopant, anneal implant damage, and set junction depth 23 of doped region 22 to substantially the desired value. It is also desirable to grow additional oxide 25 on doped region 22 in order to provide for delineation of the buried layer. These steps are conveniently accomplished in a standard furnace tube where many wafers can be accommodated at a time. The result is shown in FIG. 3.

A preferred heating sequence is as follows: 600° C. for about 120 minutes in argon, followed by an oxidation step generally at a temperature less than about 1000° C., such as for example about 830° C. for about 50 minutes in steam, and then followed by a ramp up to a temperature exceeding about 1000° C., typically about 1200° C., holding at this temperature for about 5 minutes, and then ramping down at about 5°-6° C. per minute to about 600°-750° C., then pulling the wafers. These heating and oxidation steps are described in more detail in U.S. Pat. No. 4,717,687 (Ser. No. 878,931) to J. S. Verma, entitled "Method for Providing Buried Layer Delineation."

Other heating sequences may also be used which provide sufficient temperature and time for activating the dopant and annealing the implant damage, if implanted, and for diffusing it to the desired junction depth. This may be expressed more generally by stating that the temperature and time should be chosen so that the factor $(Dt)^{\frac{1}{2}}$ is greater than $5 \times 10^{-6}$ cm, where D is the temperature dependent dopant diffusivity in the substrate in units of cm$^2$/sec and t is the time in seconds.

Where arsenic is the dopant used, it has been found that arsenic precipitates may form during the final cool-down or ramp-down stage of the above-described heating steps. For example, ramp-down rates on the order of 5°-6° C. per minute or less are commonly used following an oxidation or drive-in step. The solubility of dopant is greater at typical drive-in temperatures in the vicinity of 1000° C. or higher than at room temperature. Where the initial doping is high, as is often the case with buried layers, and the amount of dopant introduced exceeds the solid solubility limit at room temperature, then precipitation will occur during cool-down, particularly where cool-down is relatively slow, e.g., 5°-6° C. per minute or less. It has been observed that the precipitation of arsenic in this manner causes defect formation when an epi-layer is grown over such an arsenic doped region in the substrate.

It has been discovered that the defects observed in epi-layers formed over highly doped buried layers, especially over highly arsenic doped buried layers, are substantially reduced by subjecting the doped, annealed, activated, and (optionally) oxidized wafer to a very rapid heating and cooling cycle prior to epitaxial layer growth. This is accomplished for example in a Heatpulse TM type rapid thermal annealing (RTA) apparatus manufactured by AG Associates of Palo Alto, CA. Other types of RTA apparatus well known in the art may also be used. An oxidizing atmosphere is preferred for the RTA heating and cooling but other ambients including inert ambients (e.g. argon) can also be used.

EXAMPLE

Figure 4:
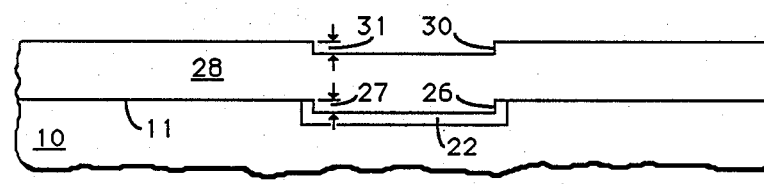

It has been found that RTA to temperatures in the range of about 1000°-1250° C. for times of about 1-60 seconds or less, with comparable heat-up and cool-down times, is useful. For example, P-type silicon wafers having a resistivity in the range 7-17 Ohm-cm, were implanted with arsenic to doses exceeding about $1 \times 10^{15}$ ions/cm$^2$, typically about $8 \times 10^{15}$ ions/cm$^2$, and subjected to the above described furnace activation, anneal, oxidation, and ramp-up, ramp-down cycle. However, instead of proceeding directly with oxide strip and epi growth as would normally be the case, these wafers were first subjected to an RTA treatment in oxygen in which the wafers were heated from room temperature (RT) to about 1100° C. in times less than about 20 seconds, generally 2-10 seconds, held at about 1100° C. for 1-30 seconds, generally about 10 seconds, and then rapidly cooled from about 1100° C. to below 600°-750° C. in 3-30 second, generally to within a few hundred degrees of room temperature in about 10 seconds or less. The surface oxide was then stripped, typically by high temperature HCl gas etching, and an epitaxial layer of N-type silicon about 1.5 micrometers thick was grown thereon. The result is shown in FIG. 4.

The surface defect densities on the epi-layer were counted on predetermined areas of each wafer by visual inspection of the wafer under a microscope. Wafers treated in the above-described manner show substantially fewer epi-layer defects over the buried layer than otherwise identically treated wafers which did not receive the RTA treatment. This is shown in the following Table which compares the defect densities in defect/cm$^2$ observed on several lots of wafers, (i) without the RTA treatment (Control Samples), and (ii) with the RTA treatment (RTA Samples).

| EPI-LAYER DEFECT DENSITIES ABOVE ARSENIC DOPED BURIED LAYER REGIONS, MEASURED IN DEFECTS/CM$^2$ | | |
|---|---|---|
| LOT | CONTROL SAMPLES | RTA SAMPLES |
| 1 | 547 | 55 |
| 2 | 256 | 27 |
| 3 | 174 | 14 |
| 4 | 112 | 14 |
| MEAN | 272 | 27 |
| SIGMA | 192 | 20 |

It is apparent that adding the RTA step following the conventional doping, activation, annealing and (optional) delineation steps, and before epitaxial growth, materially improves the quality of the epi-layer above the buried layer. There are many fewer defect. This has important benefits since the epi-layer portions above the buried layers are where the most defect sensitive device regions are generally located.

Figure 5:
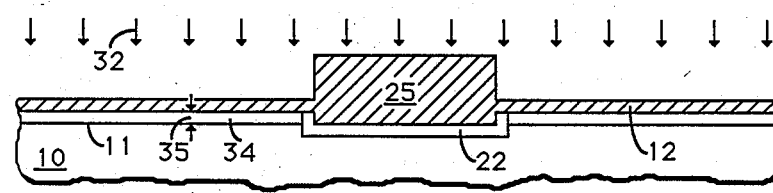
FIGS. 5–6 are views similar to FIGS. 1–4, but according to a further embodiment of the present invention.
Figure 6:
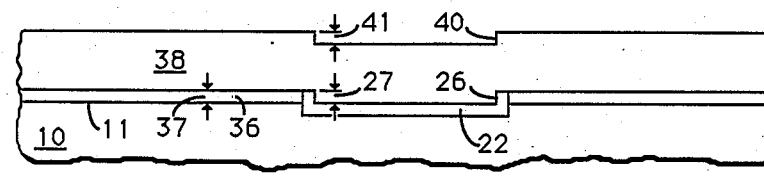

FIGS. 5 and 6 illustrate another embodiment of the present invention wherein prior to the RTA steps, another dopant 32 of opposite type, e.g., boron is implanted (FIG. 5) to form implanted region 34 of depth 35 in substrate 10. Doped region 22 is shielded from this second implant by thicker oxide 25 formed during the delineation step. After heating for activation, annealing and drive-in, implanted region 34 of depth 35 provides P+ doped region 36 of depth 37 (FIG. 6). Where the first dopant is, for example, arsenic for N+ region 22, and the second implant is, for example, boron for P+ region 36, complementary buried layers are obtained with only a single masking operation. In general, the doping in region 36 is preferably to a lower dose than the doping in region 22, but this is not essential. Following doping, dielectric layers or regions 12, 25 are removed and epi-layer 38 deposited on surface 11 of substrate 10. The result is shown in FIG. 6.

Once the buried layer doping is completed and the substrate covered by epitaxial layer 28 (FIG. 4) or 38 (FIG. 6), the buried layer is hidden. Unless some provision is made to alter the surface topography or surface structure of the substrate, the buried layer will be invisible beneath the epi-layer. This makes it difficult to align subsequent layers to the buried layer. Techniques for providing a surface feature related in a known way to the buried layer location and which is visible on the epi-layer surface are referred to in the art as "delineation". Delineation is usually accomplished by providing a surface feature in a known location on the substrate which propogates through the growing epi-layer to its outer surface.

It is most convenient if the buried layers themselves provide this surface feature. In the preferred embodiment, notch means 30 of depth 31 in FIG. 4 and notch means 40 of depth 41 in FIG. 6 identify the locations of buried layer 22 under epi-layer 28, 38 after epi-layer 28, 38 is deposited. This allows masks (not shown) which are used later in the process for forming various device regions in the epi-layer to be aligned with buried layer 22.

Delineation is conveniently accomplished by a substrate oxidation prior to epi-layer growth which consumes silicon region 26 of depth 27 and produces oxide region 25. Oxide region 25 is desirably much thicker than oxide 12 over the remainder of substrate 10. This allows oxide 25 to serve both for delineation and as a mask for a self-aligned implant of doped region 34 (FIG. 5). Region 25 above buried layer 22 is conveniently formed by the oxidation procedure previously described as part of the prepared heating sequence prior to RTA. See also U.S. Pat. No. 4,717,687 Ser. No. 878,931 to J. S. Verma, noted above.

During the formation of oxide region 25, oxide layer 12 also thickens. The oxidation cycle described above and illustrated in FIGS. 3 and 5, produces an oxide thickness of about 0.06 micrometers for layer 12 above the undoped portion of substrate 10 and an oxide thickness of about 0.45 micrometers in region 25 above (arsenic) doped portion 22 of substrate 10. The presence of large amounts of arsenic in region 22 of substrate 10 locally enhances the oxidation rate. Where dopants other than arsenic are used, those of skill in the art will understand how the semiconductor consumption and oxide thickness over the doped region vary for such different dopants and adjust the oxidation cycle accordingly.

While a particular combination of time and temperature have been described above for the oxidation portion of the preferred heating cycle prior to RTA, those of skill in the art will understand that other times, temperatures, pressures, and oxygen sources may be used with equivalent effect and that by adjustment of these parameters, a wide variety of oxide thicknesses, differential silicon consumption and oxide growth rates may be obtained.

For delineation purposes, it is important merely that notch 26 or equivalent feature be provided in the substrate surface, preferably above doped region 22 as compared to the undoped region. Notch 26 propagates through epi-layer 28, 38 (see FIGS. 4 and 6) and is visible as notch 30, 40 on the surface of epi-layer 28, 38 after epitaxial growth is completed. Substrate step height 27 for notch 26 of at least 0.1 micrometers is desirable with about 0.2 micrometers being preferred. While differential oxidation is a convenient means for providing notch 26, other methods, such as for example, etching notch 26 prior to or after implantation of ions 16, may also be used. A further method is illustrated in connection with FIGS. 7-10.

FIGS. 7-10 show cross-sections similar to FIGS. 1-3 and 5 but according to a further embodiment of the present invention employing a different delineation process. The RTA step following implant activation and annealing, junction drive-in, and delineation remains the same.

Figure 7:
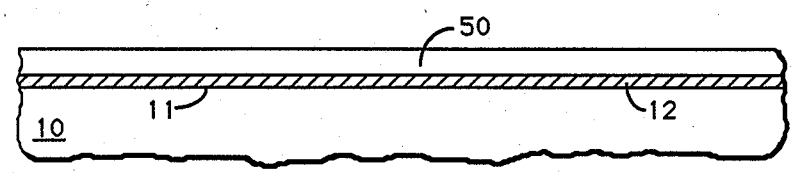
FIGS. 7–10 are views similar to FIGS. 1–3 and 5 but according to another embodiment of the present invention.

FIG. 7 is analogous to FIG. 1. Surface 11 of substrate 10 is covered by dielectric layer 12 as before. Layer 12 is then covered by oxidation resistant layer 50, for example, of silicon nitride about 0.05-0.2 micrometers thickness with about 0.1 micrometers thickness being convenient. Using means well known in the art, layer 50 is masked and opening 52 formed (FIG. 8) extending through layers 12, 50 to surface 11 of substrate 10. Ions 54 are implanted into region 56 in the same manner as previously described in connection with FIG. 2. The balance of surface 11 is protected from this implant.

Figure 8:
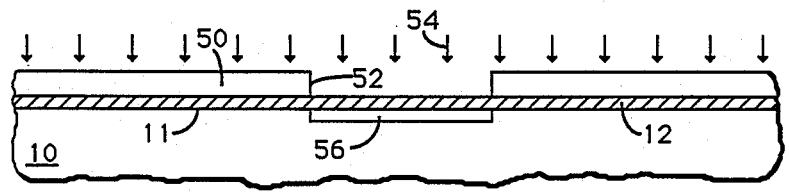
Figure 9:
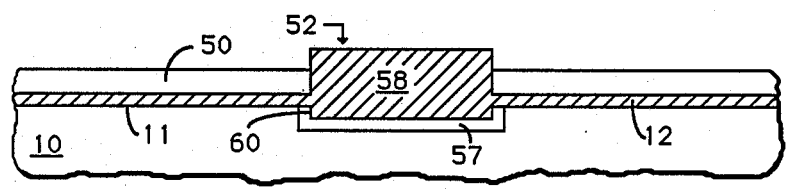

The structure of FIG. 8 is then heated to activate and anneal implant 56 and drive dopant 54 to the desired junction depth in doped region 57 (FIG. 9). The heating process also desirably includes heating in an oxidizing atmosphere so that the portion of surface 11 exposed in opening 52 is oxidized to form oxide region 58 in opening 52. This is done by thermal oxidation so that a portion of substrate 10 is consumed in the process, thereby forming delineation notch 60 (FIG. 9). Layer 50 prevents substantial oxidation of surface 11 outside opening 52, so that with layer 50, layer 12 does not thicken during the oxidation. The structure of FIG. 9 then receives the same RTA step as previously described in connection with the structure of FIGS. 3-4.

Layers or regions 12, 50, 58 are removed any time after oxidation and prior to epi growth. After the RTA step is complete and layers 12, 50, 58 removed, epi-layer 28 is grown to form the structure of FIG. 4.

Figure 10:
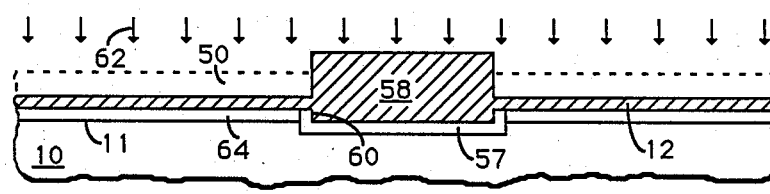

Alternatively, another implant may be performed as illustrated in FIG. 10, wherein ions 62 are implanted to form implanted region 64. Layer 50, shown as a dashed line in FIG. 10, is desirably removed prior to implanting ions 62. This provides the maximum ratio of dielectric thicknesses of oxide region 58 to oxide layer 12 so that the implant energy may be adjusted for optimum masking effect provided by oxide 58 relative to oxide 12. However, removing layer 50 is not essential so long as oxide 58 is thick enough to stop ions while permitting them to penetrate the combination of layers 12 and 50.

Following the implantation of region 64, the process proceeds as previously described in connection with FIGS. 5-6. The structure is heated to anneal, activate and drive the dopant in to the desired junction depth, then subjected to the previously described RTA step, and then epi-layer 38 formed, providing the structure shown in FIG. 6. Dielectric layers or regions 12, 50, 58 are stripped anytime after the implant and prior to epi-growth.

Having thus described the invention, it will be apparent to those of skill in the art that various modifications can be made within the spirit and scope of the present invention based on the teachings herein. For example, any method of providing epi-layer delineation may be employed, and the furnace heating cycles associated with the activation of the implants, annealing implant damage, driving the implants to the desired junction depth, and delineation prior to the RTA step may be varied to accommodate other process needs. It is important that the RTA be performed after these heating steps and before epi-layer growth. The RTA step may be performed in a variety of ambients. Low temperature pre-epi cleaning steps may be added without affecting the process. Epi-layer growth may be preceded by a high temperature surface cleaning or etching step, for example, insitu cleaning or HCl etching in the epi-reactor prior to epi-layer deposition, provided that the substrates are not slow cooled from temperatures above about 900°-1000° C. after the RTA treatment and before and epi deposition.

It is intended to include these and other variations such as will occur to those of skill in the art based on the teachings herein in the claims which follow.

We claim:

1. A method for forming buried layers in semiconductor devices, comprising:
   providing a semiconductor substrate having a principal surface;
   providing a mask on the surface having a first opening;
   implanting a first dopant through the first opening into the substrate;
   heating to a temperature exceeding at least 600° C., at least partly in an oxidizing atmosphere and for a time of about 5 minutes or longer, to activate the implant and oxidize at least the implanted part of the substrate surface;
   thereafter rapidly heating the substrate to a temperature exceeding at least 1000° C. in a time less than 30 seconds and thereafter cooling below about 750° C. in a time less than about 30 seconds; and
   forming an epitaxial layer on the substrate surface.

2. The method of claim 1 further comprising after the first dopant implanting step, implanting a second dopant of opposite type in the substrate surface.

3. The method of claim 1 wherein the step of rapidly heating the substrate comprises rapidly heating the substrate in an inert atmosphere to a temperature of about 1100° C., or larger in a time less than 20 seconds.

4. The method of claim 1 wherein the step of rapidly heating and cooling the substrate comprises cooling the substrate in an inert atmosphere to below about 750° C. in less than about 10 seconds.

5. The method of claim 1 further comprising after the step of rapidly heating and before the step of rapidly cooling, holding the substrate at a temperature exceeding about 1100° C. for a time of about 1-30 seconds.

6. A method for forming buried layers in semiconductor devices, comprising:
   providing a semiconductor substrate having a principal surface;
   providing a mask on the surface having a first opening;
   introducing into the substrate through the first opening a first dopant of diffusivity D in the substrate, where D is the temperature dependent diffusivity measured in cm$^2$/sec;
   heating to a temperature and for a time t measured in seconds so that the product $(Dt)^{\frac{1}{2}}$ has a value greater than $5 \times 10^{-6}$ cm;
   thereafter rapidly heating the substrate to a temperature exceeding at least 1000° C. in a time less than 30 seconds and thereafter cooling below about 750° C. in a time less than about 30 seconds; and
   forming an epitaxial layer on the substrate surface.

7. The method of claim 6 further comprising after the first introducing step, introducing a second dopant of opposite type in the substrate surface.

8. The method of claim 6 wherein the step of rapidly heating the substrate comprises rapidly heating the substrate in an oxidizing atmosphere to a temperature of about 1100° C. or larger in a time less than 20 seconds.

9. The method of claim 6 wherein the step of rapidly heating and cooling the substrate comprises cooling the substrate in an oxidizing atmosphere to below about 750° C. in less than about 10 seconds.

10. The method of claim 6 further comprising after the step of rapidly heating and before the step of rapidly cooling, holding the substrate at a temperature exceeding about 1100° C. for a time of about 1-30 seconds.

11. A method for forming buried layers in semiconductor devices, comprising:
    providing a semiconductor substrate having a principal surface;
    providing a mask on the surface having a first opening;
    introducing into a first region of the substrate through the first opening, a first dopant of a first conductivity type;
    heating to a temperature exceeding about 1000° C. for a time of about 5 minutes or more and then cooling below about 750° C.;
    thereafter rapidly heating the substrate to a temperature exceeding at least 1000° C. in a time less than 30 seconds and thereafter cooling below about 750° C. in a time less than about 30 seconds; and
    forming an epitaxial layer on the substrate surface.

12. The method of claim 11 further comprising after the first introducing step, introducing a second dopant of opposite type in a second region of the substrate surface substantially laterally outside the first region of their substrate.

13. The method of claim 11 wherein the step of rapidly heating the substrate comprises rapidly heating the substrate to a temperature of about 1100° C. or larger in a time less than 20 seconds.

14. The method of claim 11 wherein the step of rapidly heating and cooling the substrate comprises cooling the substrate to below about 750° C. in less than about 10 seconds.

15. The method of claim 11 further comprising after the step of rapidly heating and before the step of rapidly cooling, holding the substrate at a temperature exceeding about 1100° C. for a time of about 1-30 seconds.

16. The method of claim 11 further comprising, prior to the first heating step, oxidizing a portion of first region of the substrate surface at a temperature less than about 1000° C.

17. The method of claim 16 further comprising, prior to the oxidizing step, heating to a temperature exceeding about 600° C. but less than 1000° C. in an oxidizing atmosphere.

18. The method of claim 11 further comprising, prior to the first heating step, heating to a temperature exceeding about 600° C. but less than 1000° C. in an oxidizing atmosphere.

* * * * *